United States Patent [19]

Kimura

[11] Patent Number: 5,079,741
[45] Date of Patent: Jan. 7, 1992

[54] PORTABLE SEMICONDUCTOR STORAGE DEVICE

[75] Inventor: Masatoshi Kimura, Itami, Japan

[73] Assignee: Mitsubishi Denki Kabushiki Kaisha, Japan

[21] Appl. No.: 465,500

[22] Filed: Jan. 16, 1990

[30] Foreign Application Priority Data

Nov. 2, 1989 [JP] Japan .................................. 1-284854

[51] Int. Cl.⁵ ..................... G11C 5/14; G11C 23/00; G11C 11/50
[52] U.S. Cl. ..................................... 365/52; 365/226; 365/229; 200/336; 439/188
[58] Field of Search ........................ 365/229, 226, 52; 439/188; 200/336, 330

[56] References Cited

U.S. PATENT DOCUMENTS

| | | | |
|---|---|---|---|
| 4,255,697 | 3/1981 | Buhler III | 365/229 X |
| 4,607,351 | 8/1986 | Gerber et al. | 365/229 X |
| 4,662,736 | 5/1987 | Taniguchi et al. | 365/229 X |
| 4,889,495 | 12/1989 | Kimura | 439/60 |
| 4,890,005 | 12/1989 | Schornack | 365/229 X |

*Primary Examiner*—Alyssa H. Bowler
*Attorney, Agent, or Firm*—Leydig, Voit & Mayer

[57] ABSTRACT

A portable semiconductor storage device includes a device body, a storage circuit for storing data mounted on the body, a main cell holder removably insertable into the body for holding a main cell for supplying a power supply voltage to the storage circuit, an auxiliary cell for supplying a power supply voltage to the storage circuit when the main cell holder is removed from the body, and a switch means actuated by insertion and removal of the main cell holder to electrically disconnect the auxiliary cell from the storage circuit when the main cell holder is inserted into the body and to electrically connect the auxiliary cell to the storage device when the main cell holder is removed from the body.

3 Claims, 6 Drawing Sheets

PORTABLE SEMICONDUCTOR STORAGE DEVICE

BACKGROUND OF THE INVENTION

1. Field of the Invention

The present invention relates to a portable semiconductor storage device and particularly, to a semiconductor storage device for replacing an electrochemical cell, that retains the stored data in the device, safely and easily.

2. Description of the Related Art

Figure 9:
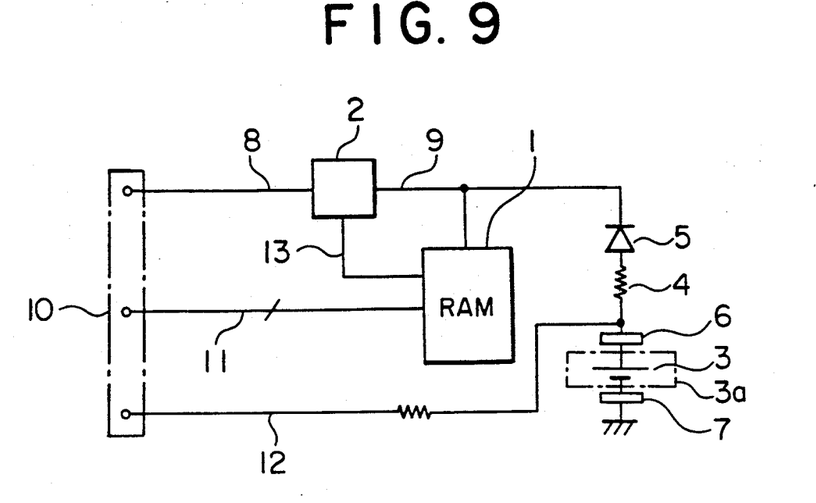
FIG. 9 is a circuit diagram illustrating a portable semiconductor storage device according to the conventional art.

A conventional portable semiconductor storage device has a configuration such as that shown in FIG. 9. The storage device has a static RAM 1, an electrochemical cell 3, i.e., a battery, connected to the RAM 1 via an internal power-supply line 9 for supplying a power-supply voltage, a diode 5 for preventing reverse charging and a current limiting resistor 4. The cell 3 is held in a cell holder 3a which is removably provided in this storage device. The cell 3 is electrically connected by stationary electrode terminals 6 and 7 when the cell holder 3a is inserted into the storage device. A power-supply input line 8 is connected to the internal power-supply line 9 via a power-supply control circuit 2. The power-supply input line 8 is connected to a connector 10. An interface bus 11 and a cell monitor output line 12 are connected to the connector 10 from the RAM 1 and the stationary electrode terminal 6 on the positive electrode of the cell 3 respectively. The power-supply circuit 2 and the RAM 1 is connected by a control line 13.

A storage device thus configured is mounted on terminal equipment (not shown) via the connector 10 when in use. When a power-supply voltage above a prescribed value is applied to the power-supply input line 8, the power-supply control circuit 2 causes this power-supply input line 8 and the internal power-supply line 9 to be connected and sends out a high-level control signal to the RAM 1 via the control line 13. As a result, a power-supply voltage is supplied to the RAM 1 via the internal power-supply line 9. The RAM 1 is brought into an enable (operable) state by the high-level control signal. The terminal equipment can access the RAM 1, for example, reading from or writing into the RAM 1 via the interface bus 11.

When access to the RAM 1 is complete and a predetermined power-supply voltage is no longer applied to the power-supply input line 8, the power-supply control circuit 2 detects that the voltage value of the power-supply input line 8 has fallen below the prescribed value. The power-supply control circuit 2 disconnects the power-supply input line 8 and the internal power-supply line 9 and sends out a low-level control signal to the RAM 1 via the control line 13. The RAM 1 is brought into a disable (non-operable) state by this signal, and any access to it by the interface bus 11 is prohibited. At this time, the power-supply voltage from the power-supply input line 8 is not supplied to the RAM 1, but the voltage of the cell 3 is supplied to it via the resistor 4 and the diode 5. Therefore, if this storage device is removed from the terminal equipment, the stored data within the RAM 1 is not erased.

The cell 3 is gradually used up by supplying a voltage to the RAM 1. The voltage of the cell 3 is checked by the terminal equipment via the cell monitor output line 12 when the storage device is mounted on the terminal equipment. When the terminal voltage of the cell 3 falls below a predetermined voltage and the replacement of the cell 3 becomes necessary, the cell 3 can be removed from the storage device together with the cell holder 3a and replaced with a new one.

Figure 10:
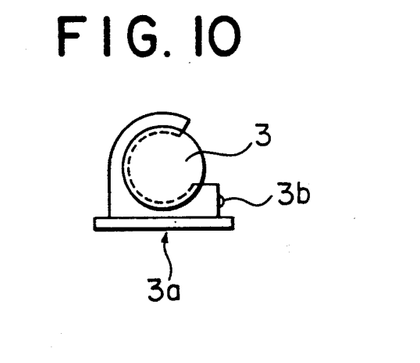
FIG. 10 is plan view illustrating a cell holder according to the conventional art.
Figure 11:
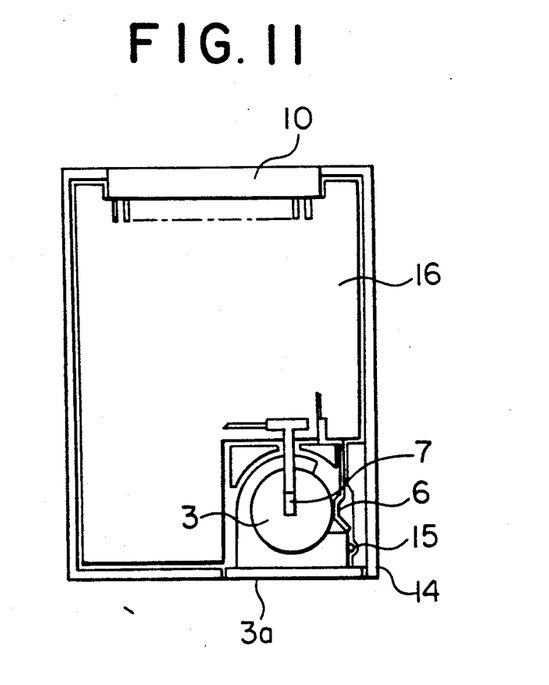
FIG. 11 is a schematic plan view illustrating an example of the conventional art.

One example of the cell holder 3a is shown in FIG. 10. A projection 3b is formed on a side of the cell holder 3a. As shown in FIG. 11, when the cell holder 3a is inserted in the storage device, the projection 3b of the cell holder 3a fits into a recess 15 on a frame 14 of the storage device, holding the cell holder 3a in place. At this time, the stationary electrode terminals 6 and 7 contact the positive and negative electrodes of the cell 3, respectively. In FIG. 11, reference numeral 16 indicates a printed circuit board, on which each of the circuit elements shown in FIG. 9 is disposed.

However, if the cell holder 3a is removed to replace the cell 3 and a predetermined voltage is not continuously applied to the power-supply input line 8, the supply of power to the RAM 1 is interrupted and the stored data within the RAM 1 will be erased. Accordingly, the replacement of the cell 3 has to be made with the storage device mounted on the terminal equipment and a predetermined voltage applied to the power-supply input line 8 via the connector 10. As a result, there exists the problem in that replacement of cells is very inefficient and inconvenient.

Also, as electronic equipment become smaller and thinner, it is sometimes virtually impossible to replace a cell with the storage device mounted on terminal equipment.

SUMMARY OF THE INVENTION

The present invention has been devised to solve the above-described problems. An object of the present invention is to provide a portable semiconductor storage device capable of replacing a built-in cell safely and easily without erasing stored data.

The portable semiconductor storage device of the present invention has a main body, a storage circuit for storing data, a main cell for supplying a power-supply voltage to the storage circuit, a main cell holder removably disposed in the device main body to hold the main cell, an auxiliary cell for supplying a power-supply voltage to the storage circuit at the time of replacement of the main cell, and switch means mechanically actuated by the mounting and removing of the main cell holder to electrically disconnect the auxiliary cell from the storage circuit when the main cell holder is mounted in the device main body and electrically connect the auxiliary cell to the storage device when the main cell holder is removed from the device main body.

DESCRIPTION OF THE PREFERRED EMBODIMENTS

Figure 1:
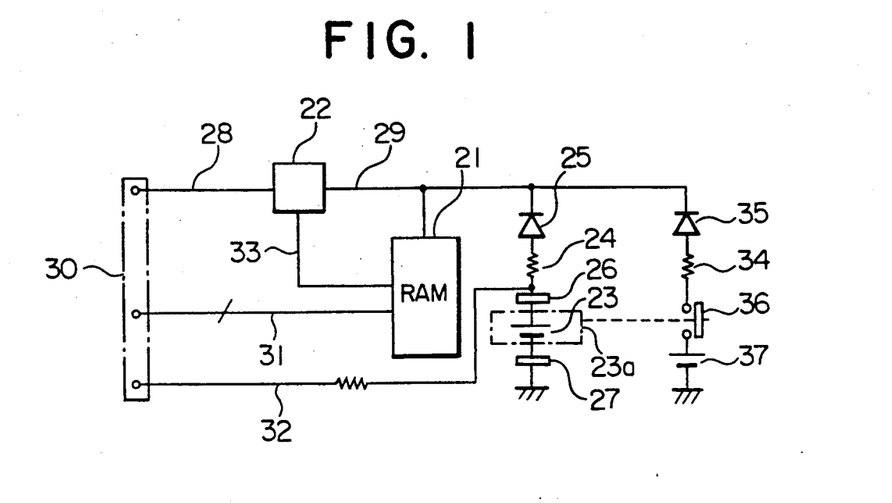
FIG. 1 is a circuit diagram illustrating the portable semiconductor storage device according to one embodiment of the present invention.

In FIG. 1, a storage device includes a static RAM 21. An internal power supply line 29 for supplying a power-supply voltage is connected to the RAM 21. A main cell 23 is connected to the internal power supply line 29 via a first reverse charging prevention diode 25 and a first current limiting resistor 24. The main cell 23 is held in a main cell holder 23a removably disposed in this storage device. When the main cell holder 23a is inserted into the storage device, the main cell 23 is electrically connected to stationary electrode terminals 26 and 27. Furthermore, an auxiliary cell 37 is connected to the internal power supply line 29 via a second reverse charging prevention diode 35, a second current limiting resistor 34 and switch means 36.

The switch means 36 is mechanically actuated by the mounting and removing operation of the main cell holder 23a. The switch 36 is opened when the main cell holder 23a is mounted in the device main body (not shown) to connect the main cell 23 between the stationary electrode terminals 26 and 27, and it is closed when the main cell holder 23a is removed from the device main body.

A power-supply input line 28 is connected to the internal power supply line 29 via a power-supply control circuit 22, and the power-supply input line 28 is connected to a connector 30. An interface bus 31 and a cell monitor output line 32 are connected to the connector 30 from the RAM 21 and the stationary electrode terminal 26 on the positive polarity side of the main cell 23, respectively. The power-supply control circuit 22 and the RAM 21 are connected by a control line 33.

The storage device shown in FIG. 1 is mounted on a terminal equipment (not shown) via the connector 30 when in use. When a predetermined power-supply voltage is applied to the power-supply input line 28 from the terminal equipment, the power-supply control circuit 22 detects the voltage, connects the power-supply input line 28 and the internal power-supply line 29 and sends out a high-level control signal to the RAM 21 via the control line 33. As a result, the RAM 21 is supplied with a power-supply voltage via the internal power-supply line 29 and is brought into an enable state by the high-level control signal. The terminal equipment can access the RAM 21, for example, reading from and writing into the RAM 21 via the interface bus 31.

When access to the RAM 21 is complete and a predetermined power-supply voltage is no longer applied to the power-supply input line 28, the power-supply control circuit 22 detects that the voltage value of the power-supply input line 28 has fallen below the prescribed value. The power-supply control circuit 22 disconnects the power-supply input line 28 and the internal power-supply line 29 and sends out a low-level control signal to the RAM 21 via the control line 33. The RAM 21 is disabled by this signal and any access to it is prohibited. At this time, the power-supply voltage from the power-supply input line 28 is not supplied to the RAM 21, but the voltage of the main cell 23 is supplied to it via the resistor 24 and the diode 25. Therefore, if this storage device is removed from the terminal equipment, the stored data within the RAM 21 is not erased.

The main cell 23 which retains the stored data in the storage device when the device is removed from the terminal equipment is gradually used up by supplying voltage to the RAM 21. The voltage of the main cell 23 is checked by the terminal equipment via the cell monitor output line 32 when the storage device is mounted on the terminal equipment. When the terminal voltage of the cell 23 falls below a predetermined voltage and the replacement of the main cell 23 becomes necessary, the main cell 23 is removed from the device main body together with the main cell holder 23a and replaced with a new one.

At this time, the switch means 36 is actuated by the removal operation of the main cell holder 23a. As a result, the auxiliary cell 37 and the second current limiting resistor 34 are connected with each other, and a voltage is supplied to the RAM 21 from the auxiliary cell 37 via switch means 36, the resistor 34 and the diode 35. Therefore, if the main cell 23 is removed from the storage device together with the main cell holder 23a when that the storage device is not mounted on the terminal equipment, the stored data within the RAM 21 is not erased. When the used main cell 23a is replaced and the removed main cell holder 23a holding a new main cell 23 is mounted in the device main body again, the switch means 36 is opened by the insertion of the main cell holder 23a. Therefore, the auxiliary cell 37 is separated from the RAM 21, and instead the new main cell 23 supplies a voltage to the RAM 21 via the resistor 24 and the diode 25.

As described above, the main cell 23 can easily be replaced while the stored data is retained when the storage device is not mounted on the terminal equipment but in a portable state.

Figure 2:
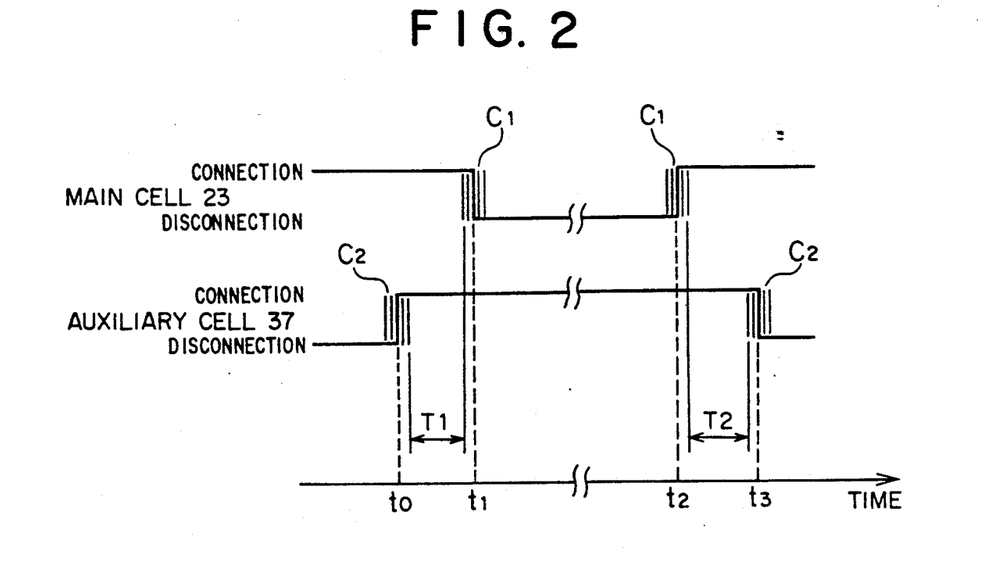
FIG. 2 is a timing chart of the connection and disconnection of each of main and auxiliary cells.

To prevent the interruption of power to the RAM 21 for even a short period of time when the main cell holder 23a is removed from the device main body, a predetermined timing is required between the mounting and removing operation of the main cell holder 23a and the operation of the switch means 36 as shown in FIG. 2, when the main cell holder 23a is removed, it is required that the switch means 36 close at time $t_0$ before time $t_1$ when the main cell 23 is separated from the stationary electrode terminals 26 and 27, connecting the auxiliary cell 37 to the RAM 21. On the other hand, when the main cell holder 23a is inserted, it is required that the switch means 36 open at time $t_3$ after time $t_2$ when the main cell 23 is connected to the stationary electrode terminals 26 and 27, disconnecting the auxiliary cell 37 from the RAM 21. Actually, the time period must be set by considering the chattering $C_1$ and $C_2$ of each contact. As shown in FIG. 2, even if the chatterings $C_1$ and $C_2$ are eliminated, the timing should preferably include time T1 and T2 if both the main cell 23 and the auxiliary cell 37 are to be reliably connected to the RAM 21.

Figure 3:
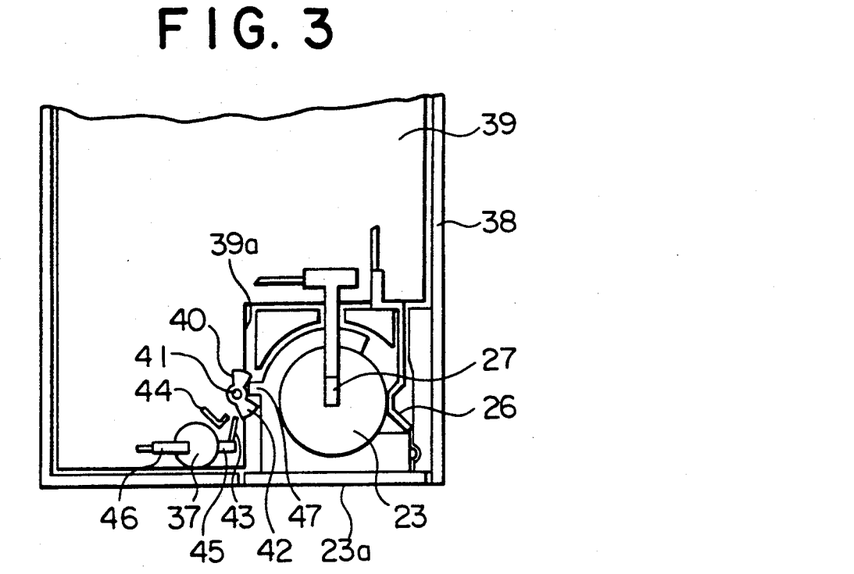
FIGS. 3 and 4 are plan views respectively illustrating an essential portion of a second embodiment.

Part of a second embodiment is shown in FIG. 3. A printed circuit board 39 is fixed within a frame 38 of a device main body. A notch 39a is formed on one corner of this printed circuit board 39, and the main cell holder 23a is inserted in the frame 38 in this notch. The stationary electrode terminals 26 and 27, each of which has one end fixed to the printed circuit board 39, are disposed within the notch 39a of the printed circuit board 39 for contacting the positive and negative terminals of the main cell 23 in the main cell holder 23a respectively. A rotary switch 40 is disposed on a portion of the printed circuit board 39 facing the notch 39a. This rotary switch 40 includes a movable contact 42 rotatably disposed around a pivot 41 and a pair of mounted contacts 43 and 44 fixed on the printed circuit board 39. The auxiliary cell 37 is disposed in the vicinity of the rotary switch 40. The auxiliary cell 37 is attached with tabs 45 and 46 which are connected to the positive and negative terminals of the auxiliary cell 37. The tab 45 on the positive side is connected to the fixed contact 43 of the rotary switch 40 by soldering.

Although not shown, each of the circuit elements shown in FIG. 1 is disposed on the printed circuit board 39. The stationary electrode terminal 27 and the tab 46 on the negative side of the auxiliary cell 37 are connected to a ground line, and the other stationary electrode terminal 26 and the fixed contact 44 of the rotary switch 40 are connected to corresponding circuit elements respectively.

A projection 47 for actuating the rotary switch 40 is disposed on the main cell holder 23a. For this reason, when the main cell holder 23a is inserted into the frame 38 as shown in FIG. 3, the projection 47 of the main cell holder 23a contacts the movable contact 42 of the rotary switch 40 and causes the movable contact 42 to be pivoted away from the fixed contacts 43 and 44. The rotary switch 40 is opened, and the auxiliary cell 37 is electrically disconnected from the RAM.

Figure 4:
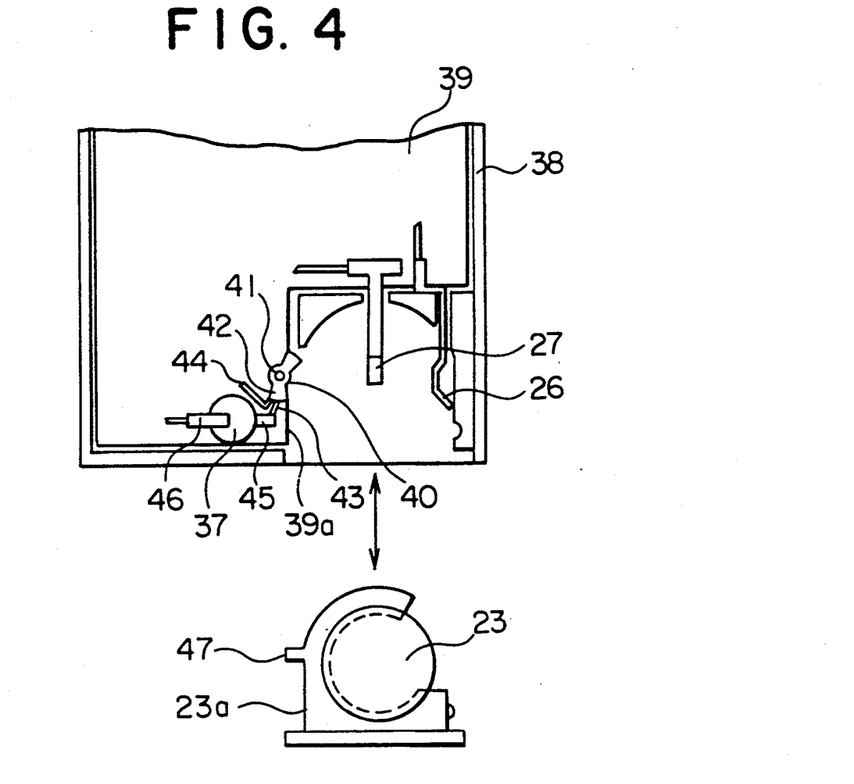

However, when the main cell holder 23a is removed from the frame 38 to replace the main cell 23, the movable contact 42 of the rotary switch 40 is rotated clockwise by the projection 47 of the main cell holder 23a, and, as shown in FIG. 4, electrically connects the contacts 43 and 44 together. The rotary switch 40 is closed and the auxiliary cell 37 is connected to the RAM.

When the main cell 23 is replaced and the main cell holder 23a holding a new main cell 23 is inserted in the frame 38 again, the positive and negative electrodes of the main cell 23 contact the fixed electrode terminals 26 and 27. This time, the projection 47 of the main cell holder 23a causes the movable contact 42 of the rotary switch 40 to rotate counterclockwise. As shown in FIG. 3, therefore, the conductor 42 is separated from the fixed contacts 43 and 44, and the connection between these fixed contacts 43 and 44 is opened.

By making the contact stroke of the fixed electrode terminals 26 and 27 with the main cell 23 longer than the stroke of the movable contact 42 for closing the fixed contacts 43 and 44 of the rotary switch 40, the timing of connection and disconnection for each of the main cell 23 and the auxiliary cell 37 can be arranged as shown in FIG. 2.

Figure 5:
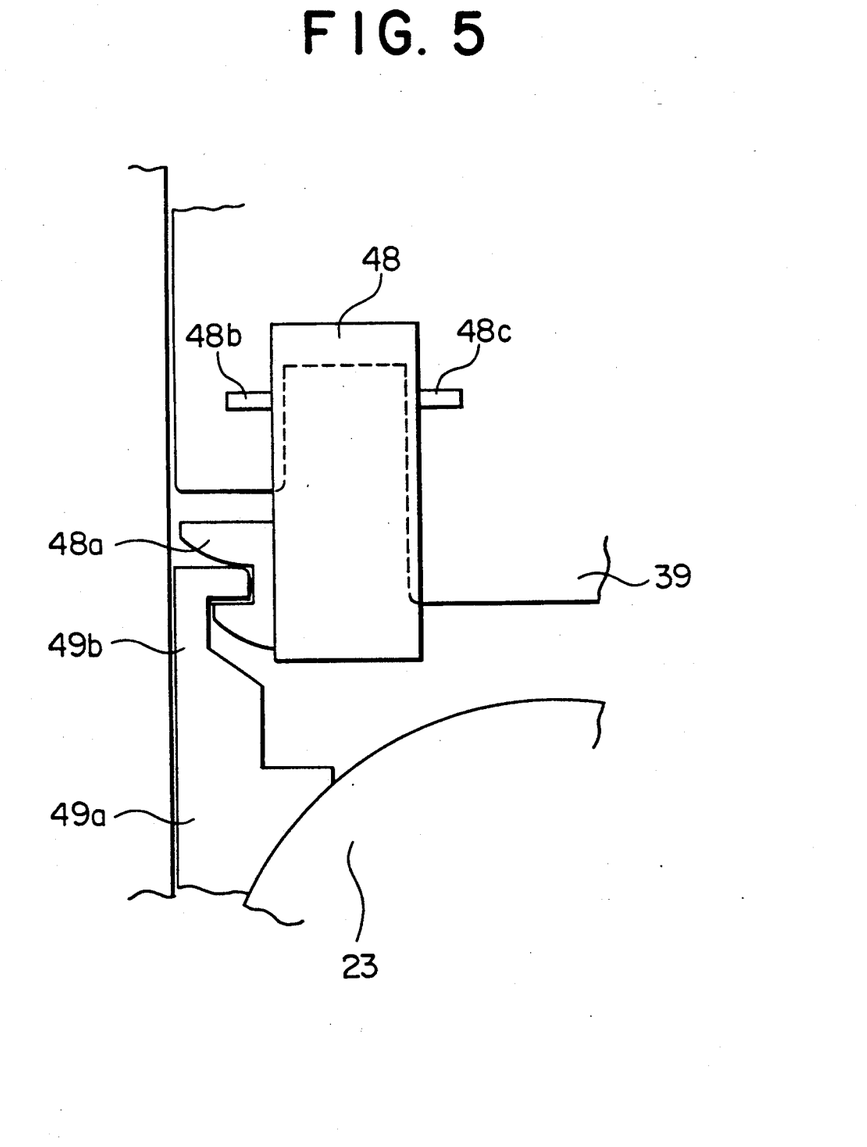
FIG. 5 is a partial plan view illustrating a modification of the second embodiment.

In the second embodiment described above, the movable contact 42 and the fixed contacts 43 and 44 are disposed on the printed circuit board 39 to form the rotary switch 40. As shown in FIG. 5, the slide switch 48 includes a movable contact 48a, and fixed contacts 48b and 48c mounted on the printed circuit board 39. Reference numeral 49b designates a projection formed on a main cell holder 49a holding the main cell 23.

Figure 6:
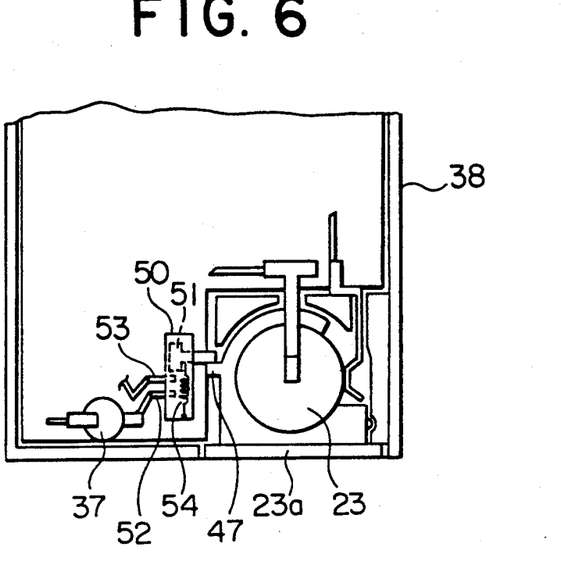
FIGS. 6 and 7 are plan views respectively illustrating portions of a third embodiment.

FIG. 6 shows part of a third embodiment. This third embodiment includes a switch 50 as the switch means 36 instead of the rotary switch 40 in the second embodiment. The switch 50 has a movable contact 51 which is linearly movable and fixed contacts 52 and 53. The movable contact 51 is urged toward the fixed contacts 52 and 53 by a spring 54.

As shown in FIG. 6, when the main cell holder 23a is inserted, the projection 47 of the main cell holder 23a causes the movable contact 51 of the switch 50 to move and to be spaced from the fixed contacts 52 and 53, thereby opening the switch 50. The auxiliary cell 37 is electrically disconnected from a RAM.

Figure 7:
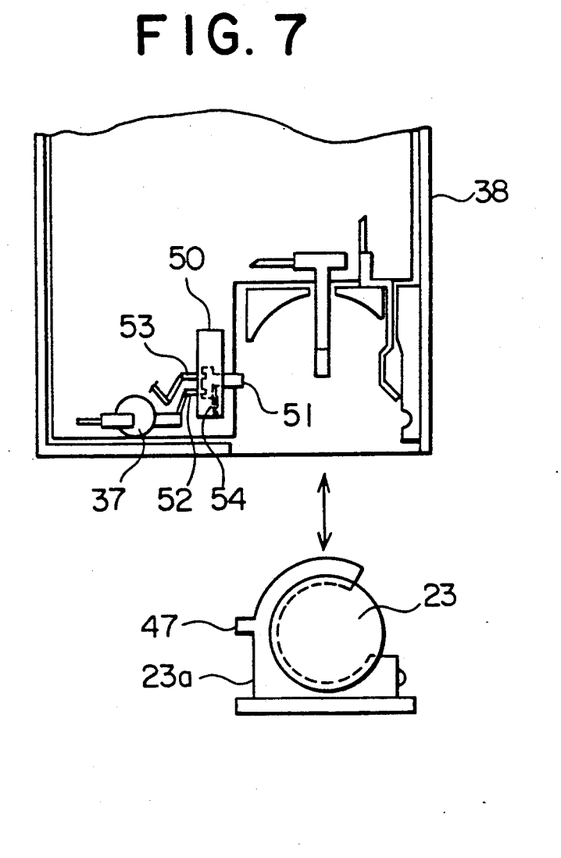

On the other hand, as shown in FIG. 7, when the main cell holder 23a is removed from the frame 38, the projection 47 of the main cell holder 23a becomes separated from the movable contact 51 of the main cell holder 23a, thereby causing the movable contact 51 to move to the fixed contacts 52 and 53 due to the action of the spring 54. As a result, the switch 50 is closed. Accordingly, the auxiliary cell 37 is electrically connected to the RAM, and a power-supply voltage is supplied to the RAM from this auxiliary cell 37.

In this third embodiment, also, by making the contact stroke of the fixed electrode terminals 26 and 27 with the main cell 23 longer than the contact stroke of the movable contact 51 for closing the switch 50, the timing of connection and disconnection for each of the main cell 23 and the auxiliary cell 37 can be set as shown in FIG. 2.

Figure 8:
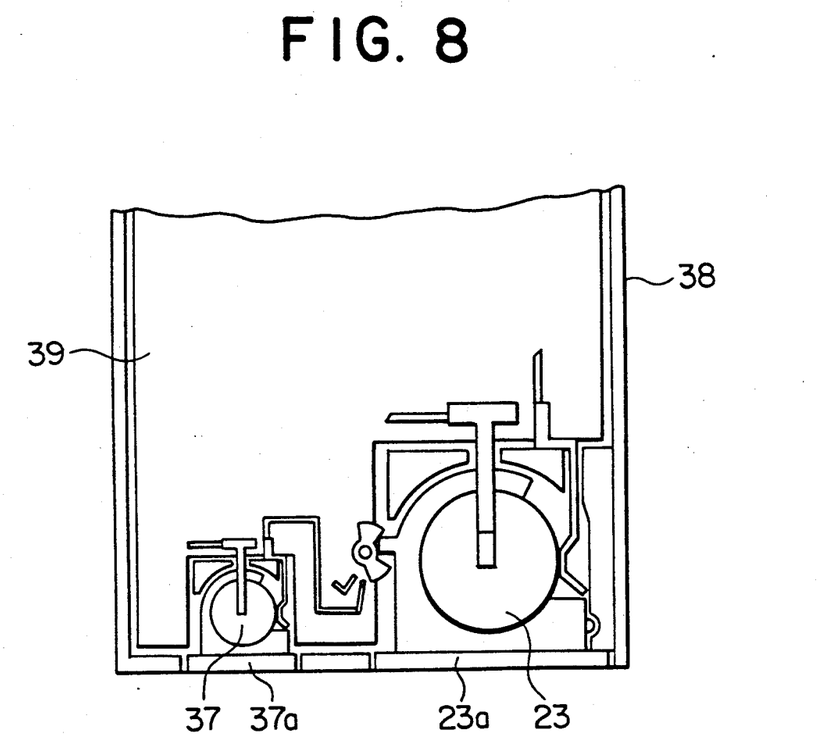
FIG. 8 is a plan view illustrating a portion of a fourth embodiment.

In the second and third embodiments, the auxiliary cell 37 with tabs was mounted on the printed circuit board 39. As shown in a fourth embodiment of FIG. 8, an auxiliary cell holder 37a may be removably disposed on the frame 38 to hold the auxiliary cell 37. Since it is not necessary for this auxiliary cell holder 37a to be linked with a switch means, a holder similar to the conventional cell holder 3a shown in FIG. 10 can be employed. By using the auxiliary cell holder 37a in this manner, the auxiliary cell 37 can be replaced easily and conveniently.

As the switch means 36, a switch having a multi-contact structure may be used. In this case, the main cell 23 and the auxiliary cell 37 can be switched using one contact and the information regarding the switching of these cells output to the terminal via the connector 30 by using the other contacts. Therefore, for example, when the auxiliary cell 37 is in use, this fact can be displayed and an alarm given. Furthermore, the switches 40, 48, and 50 are mounted on both sides of the printed circuit board 39, and these switches may be simultaneously operated by the mounting and removing of the main cell holder 23a.

What is claimed is:

1. A portable semiconductor storage device comprising:
    a device body;
    a storage circuit for storing data disposed on said body;
    a main cell holder removably insertable into said body for holding a main cell for supplying a power supply voltage to said storage circuit;
    an auxiliary cell for supplying a power supply voltage to said storage circuit when said main cell holder holding a main cell is removed from said body; and
    rotary switch mechanically actuated by insertion and by removal of said main cell holder electrically disconnecting said auxiliary cell from said storage circuit when said main cell holder is inserted into said body and electrically connecting said auxiliary cell to said storage device when said main cell holder is removed from said body.

2. A storage device according to claim 1 wherein said rotary switch is mechanically actuated to electrically disconnect said auxiliary cell from said storage circuit after said main cell holder is inserted into said body and the main cell is electrically connected to said storage circuit and to electrically connect said auxiliary cell to said storage device before said main cell holder is removed from said body and the main cell is electrically disconnected from said storage circuit.

3. A storage device according to claim 1, comprising an auxiliary cell holder for holding said auxiliary cell is removably insertable into said body.

* * * * *